United States Patent
Chang et al.

(10) Patent No.: US 12,405,300 B2
(45) Date of Patent: *Sep. 2, 2025

(54) SYSTEMS AND METHOD TO TEST SEMICONDUCTOR DEVICES

(71) Applicant: Taiwan Semiconductor Manufacturing Company Limited, Hsinchu (TW)

(72) Inventors: Chin-Hao Chang, Hsinchu (TW); Meng-Hsiu Wu, Hsinchu (TW); Chiao-Yi Huang, Zhubei (TW); Manoj Mhala, Hsinchu (TW); Calvin Yi-Ping Chao, Zhubei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/362,216

(22) Filed: Jul. 31, 2023

(65) Prior Publication Data

US 2023/0375611 A1 Nov. 23, 2023

Related U.S. Application Data

(63) Continuation of application No. 16/884,684, filed on May 27, 2020, now Pat. No. 11,754,616.

(51) Int. Cl.
*G01R 31/26* (2020.01)
*G01R 31/319* (2006.01)
*G11C 16/26* (2006.01)

(52) U.S. Cl.
CPC ... *G01R 31/2626* (2013.01); *G01R 31/31905* (2013.01); *G11C 16/26* (2013.01)

(58) Field of Classification Search
CPC .......... G01R 31/2626; G01R 31/31905; G01R 31/31707; G01R 29/26; G01R 31/2601;
(Continued)

(56) References Cited

U.S. PATENT DOCUMENTS

| 7,139,952 B2 | 11/2006 | Matsumoto et al. |
| 7,667,477 B2 * | 2/2010 | Nagata ................... G01R 29/26 |
| | | 257/E21.531 |

(Continued)

FOREIGN PATENT DOCUMENTS

TW 202001895 A 1/2020

OTHER PUBLICATIONS

Office Action issued in connection with Taiwan Appl. No. 110117684 dated May 8, 2024.

*Primary Examiner* — James C Kerveros
(74) *Attorney, Agent, or Firm* — FOLEY & LARDNER LLP

(57) ABSTRACT

A method for testing semiconductor devices is disclosed, which includes: obtaining a result measured on a semiconductor device in one of a set of tests; comparing the result with a maximum value determined among respective results that were previously measured in one or more of the set of tests and a minimum value determined among respective results that were previously measured in one or more of the set of tests; determining, based on the comparison between the first result and the maximum and minimum values, whether to update the maximum and minimum values to calculate a delta value; comparing the delta value with a noise threshold value; determining based on the comparison between the delta value and the noise threshold value, whether to update a value of a timer; determining that the value of the timer satisfies a timer threshold; and determining that the semiconductor device incurs noise.

20 Claims, 9 Drawing Sheets

(58) Field of Classification Search
CPC ... G01R 31/2646; G11C 16/26; G11C 29/1201; G11C 29/56008; G11C 29/16; G11C 2029/1206; G11C 2029/4402; G11C 29/30; G11C 29/44; G11C 29/54
USPC .......................................................... 324/613
See application file for complete search history.

(56) References Cited

U.S. PATENT DOCUMENTS

| | | | |
|---|---|---|---|
| 8,552,754 | B2 | 10/2013 | Liu et al. |
| 8,782,503 | B2 * | 7/2014 | Kaeriyama ............. H02M 1/08 714/48 |
| 11,494,007 | B1 | 11/2022 | Gokul et al. |
| 2012/0200524 | A1 | 8/2012 | Vallis et al. |
| 2014/0312918 | A1 * | 10/2014 | Massetti ................. G06F 7/588 324/613 |
| 2015/0084717 | A1 | 3/2015 | Katoh |
| 2016/0088316 | A1 | 3/2016 | Novotny |
| 2017/0110142 | A1 * | 4/2017 | Fan ......................... G10L 25/84 |
| 2017/0287490 | A1 | 10/2017 | Biswal et al. |
| 2020/0018784 | A1 | 1/2020 | Yang et al. |
| 2021/0239748 | A1 | 8/2021 | Kondo |

* cited by examiner

| 1st. Run | | #1 | #2 | #3 | #4 | #5 | #6 | #7 | #8 | #9 | #10 |
|---|---|---|---|---|---|---|---|---|---|---|---|
| Measurement Results (100 times) | 1 | 29 | 32 | 34 | 28 | 33 | 32 | 30 | 30 | 33 | 32 |
| | 2 | 28 | 29 | 29 | 30 | 31 | 30 | 31 | 28 | 32 | 33 |
| | 3 | 35 | 33 | 31 | 32 | 30 | 29 | 31 | 31 | 29 | 31 |
| | 4 | 25 | 55 | 30 | 29 | 35 | 31 | 32 | 31 | 32 | 34 |
| | 5 | 33 | 37 | 29 | 32 | 28 | 30 | 30 | 29 | 27 | 29 |
| | ... | ... | ... | ... | ... | ... | ... | ... | ... | ... | ... |
| | 97 | 30 | 29 | 33 | 29 | 31 | 32 | 32 | 31 | 30 | 32 |
| | 98 | 31 | 30 | 32 | 86 | 31 | 29 | 33 | 29 | 32 | 10 |
| | 99 | 30 | 29 | 27 | 31 | 33 | 28 | 29 | 31 | 33 | 32 |
| | 100 | 29 | 30 | 32 | 30 | 32 | 34 | 31 | 29 | 31 | 29 |
| | Max | 35 | 55 | 34 | 86 | 35 | 34 | 33 | 31 | 33 | 34 |
| | Min | 25 | 29 | 27 | 28 | 28 | 28 | 29 | 28 | 27 | 10 |
| | Delta | 10 | 26 | 7 | 58 | 7 | 6 | 4 | 3 | 6 | 24 |
| RTN Analysis Data | Noise Threshold | | | | | 50 | | | | | |
| | Tem.RTN Result | 0 | 0 | 0 | 1 | 0 | 0 | 0 | 0 | 0 | 0 |
| | Timer Value | 0 | 0 | 0 | 1 | 0 | 0 | 0 | 0 | 0 | 0 |

FIG. 4

| 2nd. Run | | #1 | #2 | #3 | #4 | #5 | #6 | #7 | #8 | #9 | #10 |
|---|---|---|---|---|---|---|---|---|---|---|---|
| Measurement Results (100 times) | 1 | 30 | 31 | 32 | 28 | 33 | 33 | 30 | 29 | 32 | 31 |
| | 2 | 28 | 29 | 30 | 29 | 31 | 29 | 29 | 28 | 31 | 30 |
| | 3 | 78 | 32 | 31 | 32 | 30 | 29 | 33 | 31 | 29 | 31 |
| | 4 | 25 | 60 | 30 | 30 | 40 | 31 | 32 | 32 | 32 | 95 |
| | 5 | 33 | 75 | 29 | 83 | 28 | 30 | 30 | 29 | 27 | 29 |
| | ... | ... | ... | ... | ... | ... | ... | ... | ... | ... | ... |
| | 97 | 32 | 29 | 32 | 29 | 31 | 32 | 32 | 33 | 30 | 30 |
| | 98 | 33 | 30 | 35 | 30 | 33 | 29 | 33 | 29 | 32 | 10 |
| | 99 | 30 | 28 | 27 | 31 | 29 | 28 | 30 | 31 | 33 | 32 |
| | 100 | 29 | 30 | 32 | 29 | 32 | 32 | 31 | 30 | 31 | 29 |
| | Max | 78 | 75 | 35 | 83 | 40 | 33 | 33 | 33 | 33 | 95 |
| | Min | 25 | 28 | 27 | 28 | 28 | 28 | 29 | 28 | 27 | 10 |
| | Delta | 53 | 47 | 8 | 55 | 12 | 5 | 4 | 5 | 6 | 85 |
| RTN Analysis Data | Noise Threshold | 50 | | | | | | | | | |
| | Tem.RTN Result | 1 | 0 | 0 | 1 | 0 | 0 | 0 | 0 | 0 | 1 |
| | Timer Value | 1 | 0 | 0 | 2 | 0 | 0 | 0 | 0 | 0 | 1 |

FIG. 5

SYSTEMS AND METHOD TO TEST SEMICONDUCTOR DEVICES

CROSS-REFERENCE TO RELATED APPLICATIONS

This application is a continuation of U.S. patent application Ser. No. 16/884,684, filed May 27, 2020, which is incorporated herein by reference in its entirety for all purposes.

BACKGROUND

Random Telegraph Noise (RTN) is a type of electronic noise that occurs in semiconductor devices. RTN can sometimes be referred to as burst noise, popcorn noise, impulse noise, bi-stable noise, or random telegraph signal (RTS) noise. RTN can include sudden step-like transitions between two or more discrete voltage or current levels, as high as several hundred microvolts, at random and unpredictable times. Each shift in offset voltage or current often lasts from several milliseconds to seconds.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 illustrates an example data array generated during a first stage when performing the method of FIG. 3, in accordance with some embodiments.

FIG. 5 illustrates the example data array generated during a second stage when performing the method of FIG. 3, in accordance with some embodiments.

DETAILED DESCRIPTION

Figure 1:
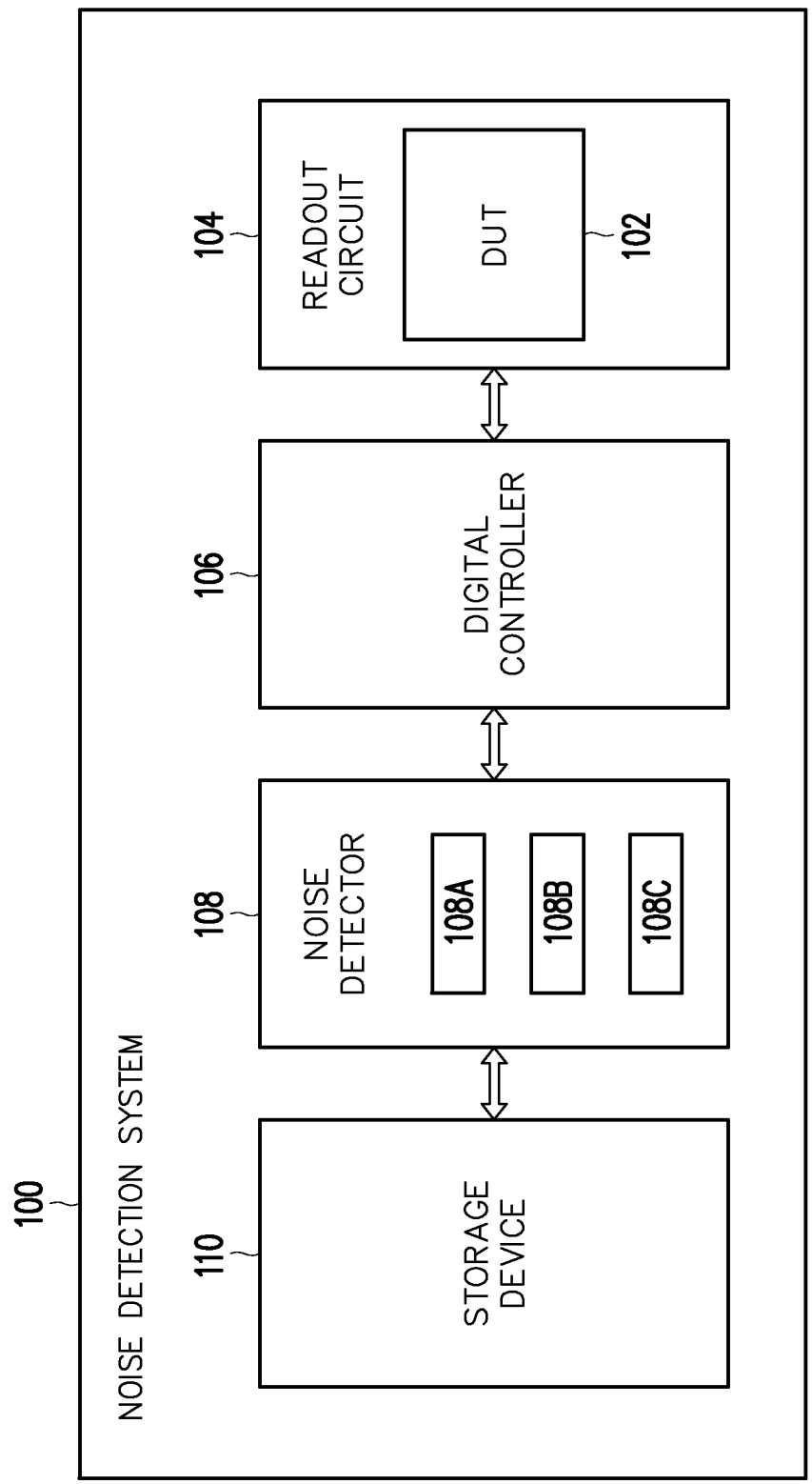
FIG. 1 illustrates a noise detection system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Advances in semiconductor technology in recent years have enabled the shrinking of minimum device feature sizes (e.g., MOS transistor gates) into a scaled-down range (e.g., less than 10 nanometers (nm)). This miniaturization is beneficial when applied to memory arrays, because of the large proportion of the overall chip area often devoted to on-chip memories. As a result, significant memory resources are often integrated as embedded memory into larger-scale integrated circuits, such as microprocessors, digital signal processors, and "system-on-a-chip" integrated circuits. However, this physical scaling of device sizes raises significant issues, in connection with embedded memory but also in memory realized as "stand-alone" memory integrated circuit devices. Several of these issues are due to increased variability in the electrical characteristics of transistors formed at these extremely small feature sizes. This variability in characteristics has been observed to increase the likelihood of read and write functional failures, on a cell-to-cell basis. Sensitivity to device variability is high in those memories that are at or near their circuit design limits. The combination of increased device variability with the larger number of memory cells (and thus transistors) within an integrated circuit renders a high likelihood that one or more cells cannot be read or written as expected.

One observed effect in such scaled-down memory cells (transistors) is referred to as "Random Telegraph Noise (RTN)." Physical defects within the gate dielectric of MOS transistors can trap charge during device operation, typically in response to bias on the transistor; other bias conditions or thermal effects can later "de-trap" or release that trapped charge. The trapping and de-trapping of charge via this mechanism is essentially a random process over time (mimicking the "dots" and "dashes" of a telegraph signal, as reflected in the common name of this mechanism). This trapping and de-trapping mechanism has an electrical effect of modulating the threshold voltage of the transistor. With the extremely small feature sizes and extremely thin gate dielectrics in modern MOS transistors, the trapping and de-trapping of even a single charge within the gate dielectric is reflected by variations in the transistor threshold voltage of as much as 10 to 20 mV. This mechanism can also cause fluctuations in the gate leakage of the transistor, with or without noticeable threshold voltage modulation.

In this regard, before shipment of these memories, the memories generally undertake one or more tests (or measurements) to confirm whether or not the memories (memory cells) will operate under predetermined conditions. Such a memory being tested is sometimes referred to as one type of a device-under-test (DUT). After the tests, existing techniques generally use statistical approaches to analyze the measurement results to detect whether the DUT incurs RTN. For example, in the context of a memory array, the respective figure-of-merit or characteristic of each memory cell of the memory array is measured in the tests. One or more statistical histograms (e.g., a standard deviation of the measured figure-of-merit of each memory cell) are generated and stored, which typically requires a storage device with the size of more than several gigabits. Further, several complicated algorithms and/or mathematical approaches (e.g., an inverse cumulative distribution function) are used to analyze the statistical histograms, which can disadvantageously increase the analysis time and the computing resource. Still further, the above-mentioned requirements (e.g., the required large storage size) can make it difficult to implement the existing techniques as an "on-chip" device, which means that a RTN detector, when using the existing techniques, is typically required to be implemented on a different chip than the chip where the DUT is disposed. Such a constraints can occupy a significant amount of the real estate of an integrated circuit. Thus, the existing techniques to detect the RTN of a DUT have not been satisfactory in every aspect.

The present disclosure provides various embodiments of a noise detection system to solve the technical issues. Instead of relying on statistical histograms, the noise detection system, as described herein, can use less complex comparison approaches to analyze a large number of measurement results. For example, in response to receiving the measurement result of a DUT, the noise detection system can dynamically compare the measurement result with previously stored boundary values (e.g., the maximum value and the minimum value). Based on the comparison, the noise detection system can dynamically update the boundary values. The noise detection system can store only the latest boundary values, which can significantly reduce the size of a coupled storage device. Further, in comparison with the complicated algorithms and/or mathematical approaches that rely on analyzing the histograms, the comparison approach that the disclosed noise detection system utilize can largely decrease the analysis time and the computing resource. For example, the analysis time may be reduced from several minutes to less than one second. Further, as the noise detection system can dynamically analyze each of the measurement results, the noise detection system can accurately detect any DUT that may be characterized with infrequently occurred RTN. Such a kind of DUT is typically neglected by the existing noise detection techniques, at least partially due to the statistical nature of the existing noise detection techniques.

Referring to FIG. 1, depicted is an example block diagram of a noise detection system 100 for detecting noise incurred in one or more semiconductor devices, in accordance with various embodiments. The noise can include any type of noise that may be incurred in a semiconductor device such as, for example, Random Telegraph Noise (RTN), in some embodiments. As shown, the noise detection system 100 includes a device-under-test (DUT) 102, a readout circuit 104, a digital controller 106, a noise detector 108, and a storage device 110. It is noted that the block diagram on FIG. 1 is simplified for illustration purposes, and thus, the noise detection system 100 can include any suitable component or element to detect noise, while remaining within the scope of the present disclosure. In some embodiments, each of the DUT 102, readout circuit 104, digital controller 106, noise detector 108, and storage device 110 are communicatively coupled with or connected to each other.

Each of the above-mentioned elements or entities is implemented in hardware, or a combination of hardware and software, in one or more embodiments. Each component of the noise detection system 100 may be implemented using hardware or a combination of hardware or software detailed below in connection with FIG. 9. For instance, each of the elements or entities shown in FIG. 9 can include any application, program, library, script, task, service, process or any type and form of executable instructions executing on hardware (e.g., of the noise detector 108). The hardware includes circuitry such as one or more processors in one or more embodiments.

The DUT 102 can include any of various types of semiconductor devices that await to be tested. In some embodiments, the DUT 102 can include a semiconductor (e.g., silicon) die or chip with one or more integrated circuits disposed thereon. In some embodiments, the DUT 102 can include one or more memory arrays, each of which has a number of memory cells arranged as an array. The memory array can include a static random access memory (SRAM) array, a dynamic random access memory (DRAM) array, a magnetoresistive random access memory (MRAM) array, a phase change random access memory (PRAM) array, a resistance random access memory (RRAM) array, or any other type of memory array being developed.

The readout circuit 104 can interface with, communicate with, or otherwise access the DUT 102 to measure or test the DUT 102. In the instance where the DUT 102 is a memory array, the readout circuit 104 can include one or more row decoder/selectors, one or more column decoder/selectors, one or more pre-charge circuits, one or more read/write circuits (e.g., sensing amplifiers). The readout circuit 104 may communicate with the noise detector 108 to retrieve one or more test conditions, one or more test parameters, or the like. Examples of the test conditions can include how many runs/loops/frames the DUT 102 shall be measured, and how many times per run the DUT 102 shall be measured. Examples of the test parameters can include the level of voltage, the level of current, and the level of temperature under which the DUT 102 is applied, when testing the DUT 102. In response to retrieving the test conditions and/or test parameters, the readout circuit 104 may apply such conditions and/or parameters to test the DUT 102. In some embodiments, the measurement results, provided by the readout circuit 104, may be in an analog form. In some other embodiments, the measurement results, provided by the readout circuit 104, may be in a digital form.

The digital controller 106 can interface with, communicate with, or otherwise access the readout circuit 104 to digitize the measurement results. For example, the digital controller 106 can include one or more analog-to-digital converters (ADCs). The ADC can convert, transform, or otherwise generate the measurement results from the analog form to a digital form. In some embodiments, the ADC can generate each of the measurement results as a ratiometric value, in accordance with various characteristics, for example, a resolution of the ADC, a supply voltage to the DUT 102, etc. The digital controller 106 can further include one or more glue logic circuits functioning as an interface. By including such a glue logic circuit, the digital controller 106 can interface with one or more components (e.g., the noise detector 108) of the noise detection system 100. In the embodiments where the readout circuit 104 can provide digitized measurement results, the digital controller can include one or more such glue logic circuits interfacing the digital controller 106 with, for example, the noise detector 108.

The noise detector 108 can interface with, communicate with, or otherwise access the digital controller 106 to obtain the digitized measurement results. In some embodiments, the noise detector 108 can include a data processor 108A, an RTN DUT identifier 108B, and an RTN DUT switcher 108C. The components 108A-C of the noise detector 108 can collectively or respectively analyze the measurement results to identify one or more devices of the DUT 102 that may incur RTN. For example, upon obtaining the measurement result of a device of the DUT 102, the data processor 108A can sort the measurement result. In some embodiments, the data processor 108A can compare the measurement result with the latest boundary values stored in the storage device 110 to determine whether to update the boundary values. The data processor 108A can use such dynamically updated boundary values to determine a delta value. For example, the delta value may be a difference between the boundary values. By comparing the delta value with a noise threshold, the RTN DUT identifier 108B can determine whether to update a timer value, which can be used as a temporary or final measure to assess whether a certain device incurs RTN. Details of the timer value shall be discussed below. By consecutively or iteratively analyzing the measurement results over specified times of tests, the timer value can be dynamically updated. Based on the timer value, the RTN DUT identifier 108B can determine whether the corresponding device of the DUT 102 may incur RTN. In response to identifying one or more devices of the DUT 102 that incur RTN, the RTN DUT switcher 108C can generate a map (or matrix) identifying such device(s). The operations of the noise detector 108 shall be discussed in further detail below.

The storage device 110 can store various results analyzed by the noise detector 108, which shall be discussed below. Rather than being required to store a large number of histograms (as the exiting techniques), the noise detector 108 may significantly reduce the amount of data to be stored in the storage device 110 by adopting the RTN detection methods disclosed herein. In this way, a size of the storage device 110 can be reduced down to the range of several hundreds of kilobits, which advantageously allows the storage device 110 to be integrated into a single chip where other components of the noise detection system 100 are disposed. For example, the storage device 110 can include a memory selected from the group consisting of: an embedded flash memory, a static random access memory (SRAM), a magnetoresistive random access memory (MRAM), and a register array.

Figure 2:
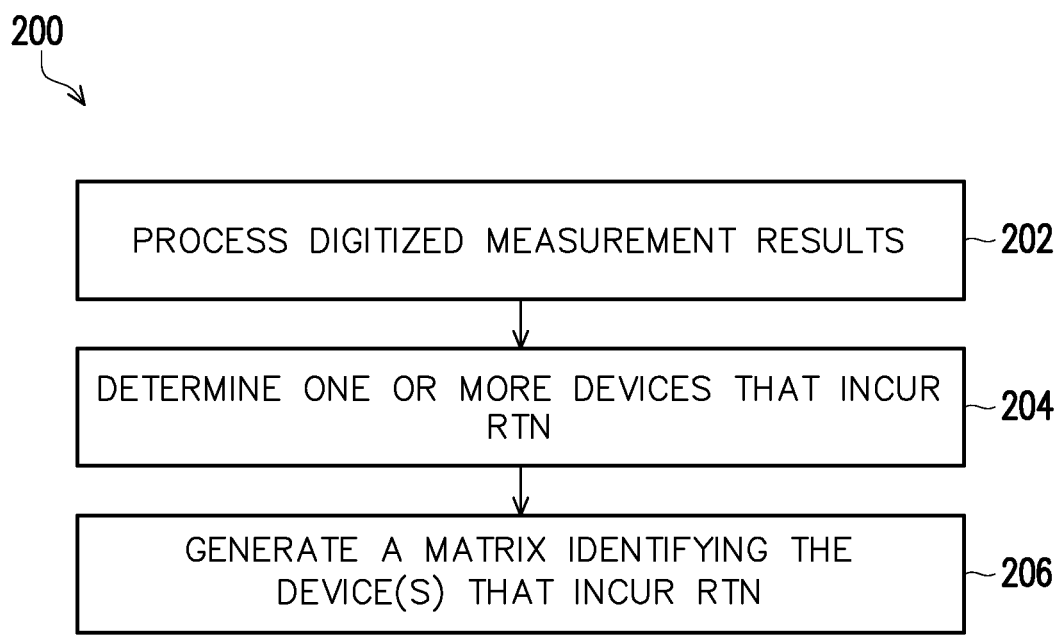
FIG. 2 illustrates a flow chart of a method for testing semiconductor devices, in accordance with some embodiments.

Referring to FIG. 2, depicted is a flow diagram of a method 200 for detecting noise (e.g., RTN) in semiconductor devices. The operations of the method 200 can be implemented using, or performed by, the components detailed herein in connection with FIG. 1. The illustrated embodiment of the method 200 is merely an example. Therefore, it is understood that any of a variety of operations may be omitted, re-sequenced, and/or added while remaining within the scope of the present disclosure.

In brief overview, the method start with operation 202 of processing digitized measurement results. The method continues to operation 204 of determining one or more devices that incur RTN. The method continues to operation 206 of generating a matrix identifying the device(s) that incur RTN. In some embodiments, the operations 202, 204, and 206 can be performed by the data processor 108A, the RTN DUT identifier 108B, and the RTN DUT switcher 108C, respectively. Each of the operations 202-206 can include one or more operations, which shall be discussed with respect to the method 300 of FIG. 3.

Figure 3:
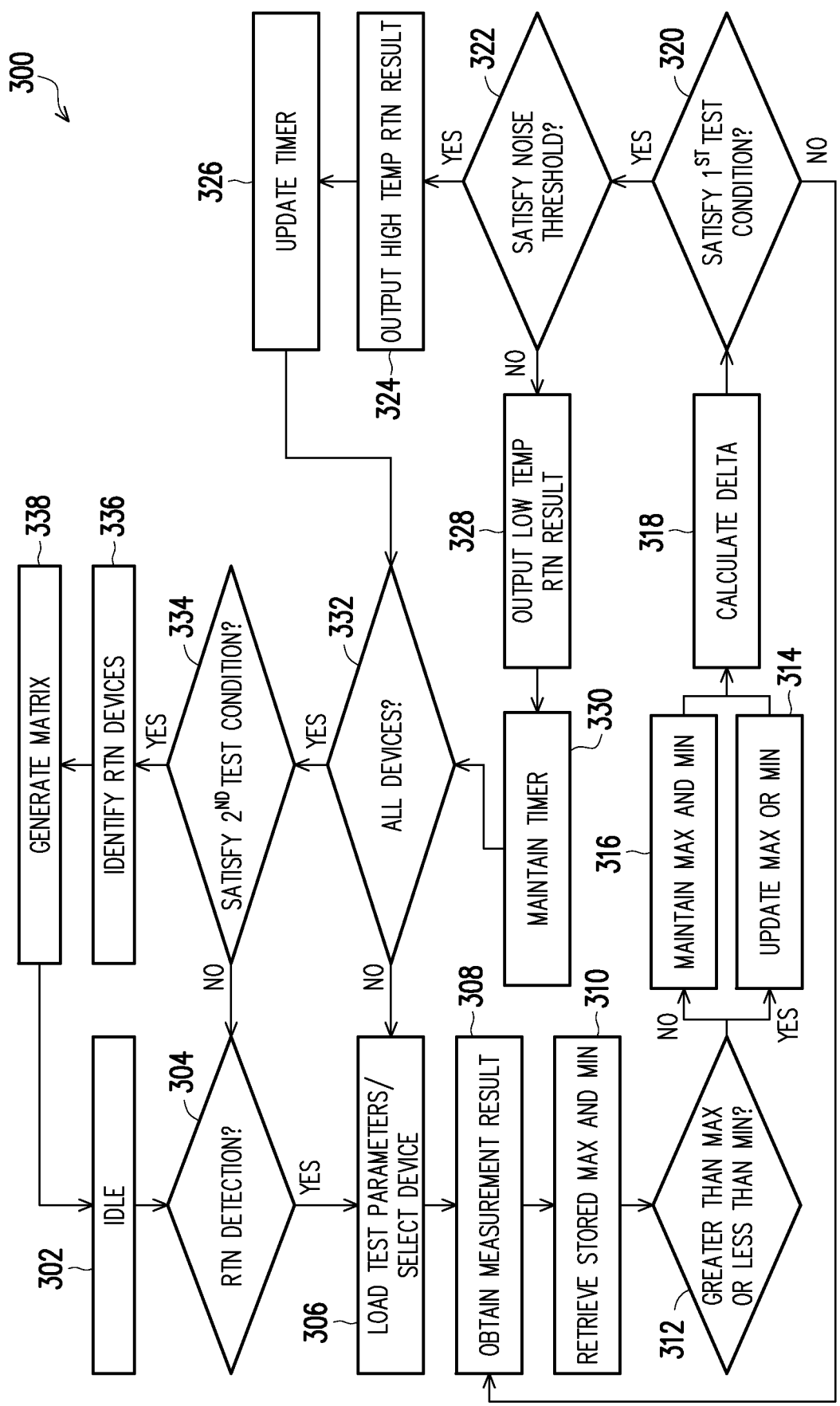
FIG. 3 illustrates a flow chart of a method further illustrating the method of FIG. 2, in accordance with some embodiments.

FIG. 3 depicts a flow diagram of the method 300 for detecting noise (e.g., RTN) in semiconductor devices. One or more of the operations of the method 300 can correspond to each of the operations 202-206 of FIG. 2. The illustrated embodiment of the method 300 is merely an example. Therefore, it is understood that any of a variety of operations may be omitted, re-sequenced, and/or added while remaining within the scope of the present disclosure.

In brief overview, operations 302, 304, 306, 308, 310, 312, 314, 316, and 318 can correspond to operation 202 of FIG. 2; operations 320, 322, 324, 326, 328, 330, 332, 334, and 336 can correspond to operation 204 of FIG. 2; and operation 338 can correspond to operation 206 of FIG. 2.

Still referring to FIG. 3, and in further detail, a noise detector (e.g., 108 in FIG. 1) can be in an idle or inactivated state at 302. In some embodiments, after a predefined number of runs (each run including a predefined number of tests) and corresponding analysis being performed on a DUT (e.g., 102 in FIG. 1), the noise detector 108 (or the data processor 108A) may selectively transition the noise detector 108 to an idle state. For example, the data processor 108A can receive a deactivation control signal from a controller (not shown) that instructs the noise detector 108 to switch to the idle state prior to, concurrently with, or subsequently to performing all the runs of tests. In another example, the data processor 108A may automatically switch or transition the noise detector 108 to the idle state in response to determining that all the runs of tests have been performed, which shall be discussed below. While in the idle state, the data processor 108A can determine whether a RTN detection functionality has been activated (304). The data processor 108A can make such a decision based on whether an activation control signal that instructs the noise detector 108 to switch or transition from the idle state to an active state has been received.

In response to receiving the activation signal, the data processor 108A can load, retrieve, or otherwise identify test parameters and test conditions, and/or select a first device of the DUT 102 to be tested (306). The data processor 108A may identify the test parameters and test conditions from the activation control signal and/or from a storage device based on the activation control signal. The test parameters may include the respective range of each of a number of test parameters (e.g., a temperature range, a voltage range, a current range, etc.). The test conditions may include how many number of runs and how many number of tests of each run that each device of the DUT 102 shall undertake.

In an example where the DUT 102 includes an SRAM array (having 10 memory cells), the test parameters can include the range of voltage/current/temperature to be applied on each of the memory cells of the DUT 102 while testing (e.g., reading and/or writing) the memory cells. The noise detector 108 may communicatively interface with the readout circuit 104 to test the memory cell based on the test parameters. Further, the data processor 108A may communicatively interface with the readout circuit 104 to select a first one of the 10 memory cells (e.g., memory cell #1) and put the memory cell in test a number of times specified according to the test parameters and test conditions. For example, the test condition may specify each of the memory cells of the DUT 102 shall be tested 100 times for each run, and a total of 2 runs shall be performed. In accordance with some embodiments, in response to identifying the test conditions (e.g., the number of tests per run and the number of runs), the data processor 108A can provide, construct, or otherwise generate a data array or structure to be filled with the measurement results. The data array may have dimensions determined according to the test conditions, which shall be discussed in further detail below with respect to data array 400 of FIGS. 4 and 5.

In response to loading the test conditions and parameters, selecting a memory cell of the DUT 102, and causing the readout circuit 104 to test the selected memory cell, the data processor 108A can obtain one or more measurement results of the selected memory cell (308). In some embodiments, the data processor 108A can obtain the measurement results, which may be in a digital form, by communicatively interfacing with the digital controller 106.

Continuing with the above example, at 308, the data processor 108A can obtain a first measurement result of the memory cell #1. The measurement result can be a digitized figure-of-merit (e.g., an $I_{on}/I_{off}$ ratio, a static noise margin (SNM), etc.) of the memory cell #1. In some embodiments, the readout circuit 104 can test the memory cell #1 to obtain a measurement result in an analog form, and the digital controller 106 can convert the analog measurement result into a digitized measurement result. Upon obtaining the digitized first measurement result from the digital controller 106, the data processor 108A can fill the above-mentioned data array with the digitized first measurement result.

Next, at 310, in response to obtaining a measurement result of the selected device of the DUT 102, the data processor 108A can communicatively interface with the storage device 110 to retrieve, read, or otherwise identify a first boundary value and a second boundary value. In some embodiments, the first boundary value can correspond to a maximum value determined among one or more previous measurement results; and the second boundary value can correspond to a minimum value determined among the one or more previous measurement results. The storage device 110 can store the latest updated (or maintained) maximum value and minimum value, which may be each presented by a relatively low number of bits. As such, a size requirement of the storage device 110 can be advantageously reduced. For example, the size of the storage device may be reduced down to several hundreds of kilobits (e.g., 200 kilobits).

Upon retrieving the latest updated maximum value and minimum value, the data processor 108A can compare the measurement result with the maximum value and minimum value (312). If the measurement result is greater than the maximum value or less than the minimum value, the data processor 108A can update the maximum value or the minimum value (314). In some embodiments, the data processor 108A can communicatively interface with the storage device 110 to update the previously stored maximum value or minimum value with the current measurement result. On the other hand, if the measurement result is neither greater than the maximum value nor less than the minimum value, the data processor 108A can maintain the maximum value and the minimum value stored in the storage device 110 (316). According to various embodiments, every time the data processor 108A obtains a new measurement result, the data processor 108A can dynamically compare the measurement result with the latest updated (or maintained) maximum value and minimum value. In certain cases where the maximum value and minimum value are not available (e.g., the first time of test), the data processor 108A can store, in the storage device 110, the corresponding measurement result as both the maximum value and minimum value.

Based on the comparison to determine whether to update or maintain the maximum value and minimum value (312, 314, 316), the data processor 108A can calculate a delta value (318). The delta value is a difference between the maximum value and minimum value. In some embodiments, every time the data processor 108A obtains a new measurement result and compares the measurement result with the latest maximum value and minimum value, the data processor 108A can calculate the delta value based on the latest maximum value and minimum value.

Upon calculating a delta value, the noise detector 108 (e.g., the RTN DUT identifier 108B) can determine whether a first part of the test condition has been satisfied (320). In some embodiments, the first part of the test condition (hereinafter "$1^{st}$ test condition") may specify how many times each of the devices of the DUT 102 shall be tested in each run. If the $1^{st}$ test condition has been satisfied (e.g., the selected device has been tested the specific times and the noise detector 108 has obtained all corresponding measurement results), the RTN DUT identifier 108B can compare the last delta value, which is calculated based on the last updated maximum value and minimum value for each run, with a noise threshold (322). The noise threshold may be predefined as a constant value. On the other hand, if the $1^{st}$ test condition has not been satisfied (e.g., the selected device has not been tested for the specific times), the method 300 can proceed again to 308, which causes the data processor 108A to obtain one or more measurement results on the selected device. In some embodiments, the method 300 may iteratively proceed from 308 to 320 until the $1^{st}$ test condition has been satisfied.

At 322, if the last delta value has satisfies (e.g., greater than or equal to) the noise threshold, the RTN DUT identifier 108B can output a temporary RTN result to be logic high (324). For example, in response to determining that the last delta value is greater than or equal to the noise threshold, the RTN DUT identifier 108B can "digitize" the comparison result by outputting the temporary RTN result as a logic high (e.g., a logic "1"). Accordingly, the RTN DUT identifier 108B can update the value of a timer (326). In some embodiments, in response to the temporary RTN result being output as logic high, the RTN DUT identifier 108B can consecutively increase or decrease the timer value by one. On the other hand, if the last delta value has not satisfied (e.g., less than) the noise threshold, the RTN DUT identifier 108B can output the temporary RTN result to be logic low (328). Accordingly, the RTN DUT identifier 108B can maintain the timer value (330). In some embodiments, the RTN DUT identifier 108B can store, in addition to the latest maximum value and minimum value, the last delta value, the temporary RTN result, and the timer value in the storage device 110.

Upon updating or maintaining the timer value for the selected device of the DUT 102, the RTN DUT identifier 108B can determine whether all the devices of the DUT has been tested for the specified times (332). If the RTN DUT identifier 108B determines that not all the devices have been tested the specified times (not each device satisfying the $1^{st}$ test condition), the method 300 can proceed again to 306, which causes the data processor 108A to select the next device to be tested. As such, method 300 may iteratively proceed from 306 to 332 until all the device have satisfied the $1^{st}$ test condition. On the other hand, if at 332, the RTN DUT identifier 108B determines that all the devices have been tested the specified times (each device satisfying the $1^{st}$ test condition), the RTN DUT identifier 108B can further determine whether a second part of the test condition has been satisfied (334). In some embodiments, the second part of the test condition (hereinafter "$2^{nd}$ test condition") may specify how many runs each of the devices of the DUT 102 shall be tested.

At 334, if the RTN DUT identifier 108B determines that not all the devices of the DUT 102 have been tested for the specified runs, the method 300 may proceed again to 304 to cause the noise detector 108 to further test the DUT 102. Alternatively, the noise detector 108 may switch to the idle state after determining that not all the devices of the DUT 102 have been tested for the specified runs. On the other hand, if the RTN DUT identifier 108B determines that all the devices of the DUT 102 have been tested the specified runs, the RTN DUT identifier 108B can identify the devices that may incur RTN (336). Such devices may herein be referred to as "RTN devices." In some embodiments, every time the noise detector 108 analyzes the measurement results for each of the devices after one run (e.g., 326 or 330), the RTN DUT identifier 108B can determine to update or maintain the corresponding timer value. Upon determining that all the devices have satisfied the $2^{nd}$ test condition, the RTN DUT identifier 108B can identify the RTN device(s) based on the respective timer value(s). For example, the RTN DUT identifier 108B can identify (or affirm) a device as an RTN device based on determining that the corresponding timer value is equal to or greater than a timer threshold. In some embodiments, the timer threshold may be predefined in accordance with the $2^{nd}$ test condition. For example, when the $2^{nd}$ test condition specifies 2 runs, the timer threshold may be equal to or less than the number of runs (e.g., 1 or 2).

In some embodiments, the RTN DUT switcher 108C can identify such RTN devices by respective positions in an array, addresses in an array, or otherwise identifiers. Based on the identifiers, the RTN DUT switcher 108C can generate a matrix or a map locating the positions of the RTN devices (338). In an example where the DUT 102 includes a 10×10 memory array (a total of 100 memory cells), after identifying one or more memory cells out of the 100 memory cells that incur RTN (e.g., the memory cells arranged on column 1 and row 2, column 8 and row 1, column 3 and row 9) by performing at least some of the operations of method 300, the RTN DUT switcher 108C can generate a map, which may also have a dimensions of 10 columns and 10 rows, that labels those three memory cells (RTN devices), which can cause these RTN devices to be switched out from being used.

Referring now to FIG. 4, a symbolic diagram of the data array 400 is depicted, in accordance with various embodiments. Continuing with the above example where the test condition specifies that each of the 10 memory cells of the DUT 102 (memory cell #1, #2, #3, #4, #5, #6, #7, #8, #9, and #10) shall be tested 100 times in each run (the 1st test condition), and a total of 2 runs (the $2^{nd}$ test condition) shall be performed, the data array may have at least 10×100 fields, 401, to be filled with the measurement results. As shown in FIG. 4, in response to obtaining the respective measurement results of the memory cell #1 to #10 from the 100 times of tests in the first run, the noise detector 108 can fill the corresponding fields with the measurement results. In addition to the measurement results, the noise detector 108 may include further fields in the data array to fill in corresponding RTN analysis data.

For example, every time the noise detector 108 obtains a new measurement result, the noise detector 108 may selectively update the maximum value and minimum value, and calculate the delta value, as described above. The noise detector 108 can include the maximum value, the minimum value, and the calculated delta value in the data array 400. Upon finishing all the tests in one of the runs (e.g., the first run as shown in FIG. 4), the noise detector 108 can compare the last delta value with the noise threshold. Based on the comparison, the noise detector 108 can output the temporary RTN result to be either logic high ("1") or low ("0"). The noise detector 108 can include the temporary RTN result in the data array. Based on the temporary RTN result, the noise detector 108 can selectively update the timer value. The noise detector 108 can include the timer value in the data array.

As shown in FIG. 4, after the 100th test on the memory cell #1, the noise detector 108 can update or maintain the maximum value and minimum vale to be "35" and "25," respectively, which renders the last delta value for the first run to be "10." Accordingly, the noise detector 108 can determine whether the delta value is greater than or equal to a noise threshold, which is predefined as "50" in the current example. Since the delta value of memory cell #1 (10) is neither greater than or equal to the noise threshold (50), the noise detector 108 can output the temporary RTN result to be "0," and maintain the timer value to be "0." Similarly, after the 100th test on each of the remaining memory cells, the noise detector 108 can calculate the last delta values of the memory cells #2, #3, #4, #5, #6, #7, #8, #9, and #10 to be "26," "7," "58," "7," "6," "4," "3," "6," and "24," respectively. Based on comparing each of the last delta values with the noise threshold, the noise detector 108 determines that the timer value of every memory cell shall be maintained to be "0" except for the memory cell #4. In some embodiments, after the first run (meeting the 1st test condition) which produces a "tentative" timer value, the noise detector 108 may tentatively (or with a lower score) determine the memory cell #4 as an RTN device.

FIG. 5 depicts the same data array 400 updated based on the second run of tests that the memory cells #1 to #10 undertake. As shown, after the second run, the noise detector 108 calculates the last delta values of the memory cells #1, #2, #3, #4, #5, #6, #7, #8, #9, and #10 to be "53," "47," "8," "55," "12," "5," "4," "5," "6," and "85," respectively. Based on comparing each of the last delta values with the noise threshold, the noise detector 108 determines that the memory cells #1, #4, and #10 shall each correspond to a high temporary RTN result. Accordingly, the noise detector 108 can update the timer values of the memory cells #1, #4, and #10 to be "1," "2," and "1," respectively. Specifically, the noise detector 108 update the timer value for memory cell #1 by incrementing "1" from "0," which was determined from the first run; the timer value for memory cell #4 by incrementing "1" from "1," which was determined from the first run; and the timer value for memory cell #10 by incrementing "1" from "0," which was determined from the first run. In the example where the timer threshold is predefined as 1, the noise detector 108 can identify the memory cells #1, #4, and #10 as the RTN devices while the remaining memory cells #2, #3, #5, #6, #7, #8, and #9 as non-RTN devices because each of the memory cells #1, #4, and #10 presents a timer value equal to or greater than the timer threshold. In some embodiments, after the second run (meeting both the $1^{st}$ and $2^{nd}$ test conditions) which produces an "affirmative" timer value, the noise detector 108 may affirmatively (or with a higher score) determine the memory cell #10 as an RTN device.

Figure 6:
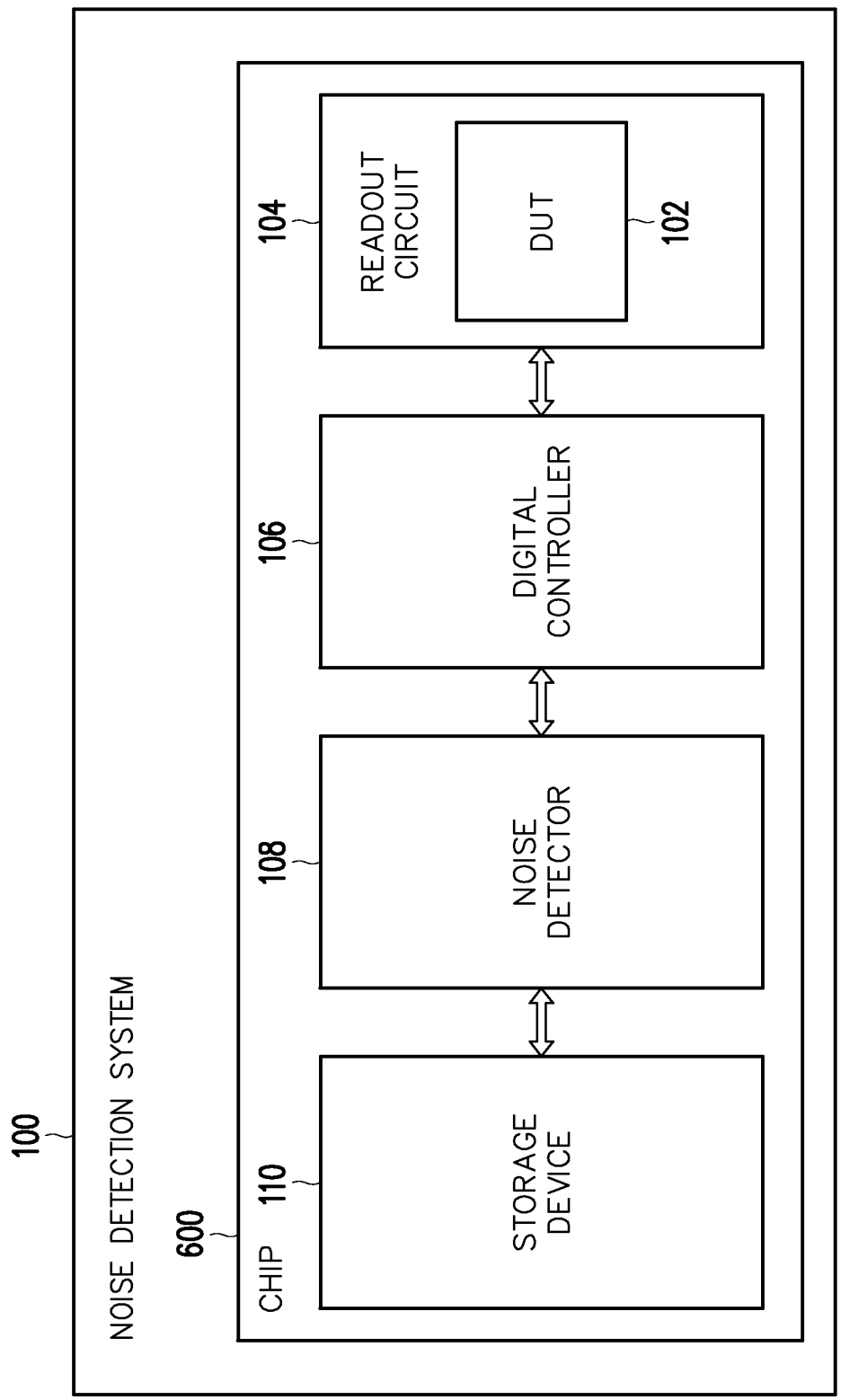
FIG. 6 illustrates an example real estate arrangement of the noise detection system of FIG. 1, in accordance with some embodiments.
Figure 7:
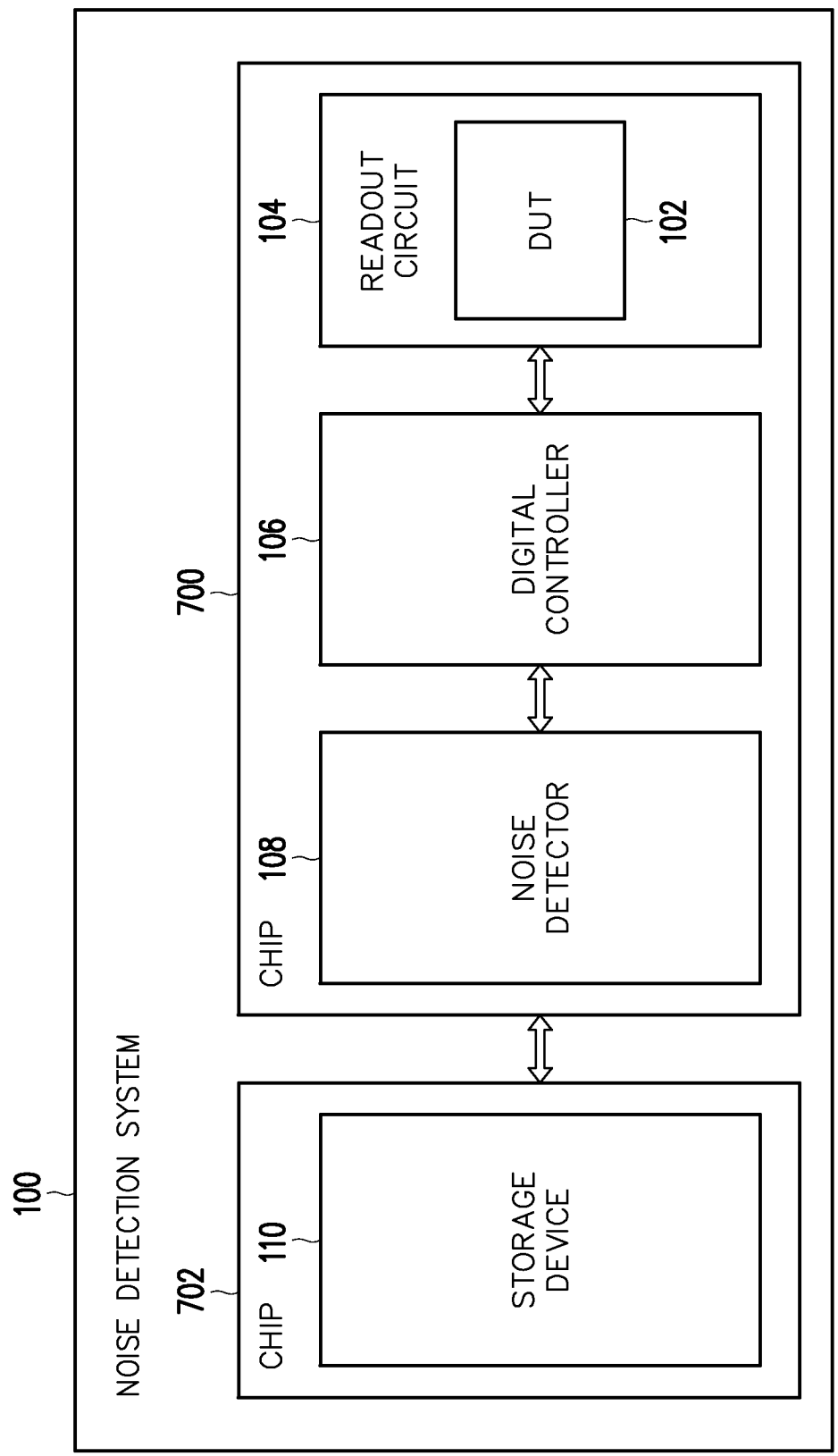
FIG. 7 illustrates another example real estate arrangement of the noise detection system of FIG. 1, in accordance with some embodiments.
Figure 8:
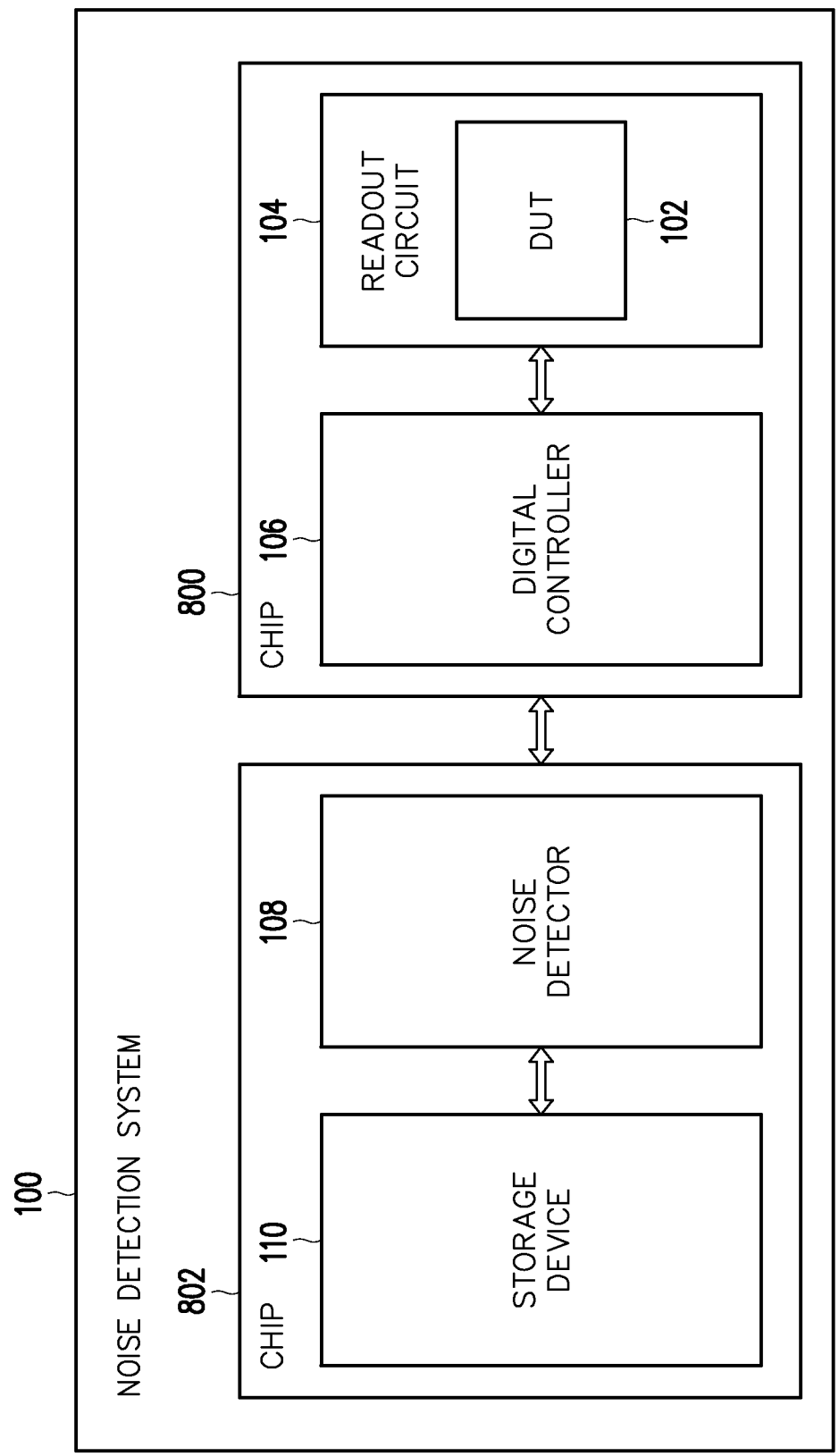
FIG. 8 illustrates yet another example real estate arrangement of the noise detection system of FIG. 1, in accordance with some embodiments.

FIGS. 6, 7, and 8 respectively depict various embodiments of different real estate arrangements of the noise detection system 100. As mentioned above, the algorithms that the noise detection system 100 utilizes to analyze RTN incurred in semiconductor devices are less complicated than the existing techniques. As such, arranging the real estate of the components of the noise detection system 100 can be relatively flexible.

FIG. 6 shows an example where the DUT 102, the readout circuit 104, the digital controller 106, the noise detector 108, and the storage device 110 are integrated into (or disposed on) a single integrated circuit (e.g., silicon) chip 600. Although each of the components on the chip 600 is illustrated as a discrete circuit, it is understood that any two or more of the components (e.g., 106 and 108) can be integrated as one circuit. In some embodiments, as the noise detector 108 and the storage device 110 are disposed on the same chip as the DUT 102, the noise detector 108 and the storage device 110 may be referred to as "on-chip" circuits. Such an on-chip storage device may include an embedded flash memory, an SRAM memory, an MRAM memory, and a register array.

FIG. 7 shows an example where the DUT 102, the readout circuit 104, the digital controller 106, and the noise detector 108 are integrated into (or disposed on) a first integrated circuit (e.g., silicon) chip 700, while the storage device 110 is disposed on a second integrated circuit (e.g., silicon) chip 702. Although each of the components on the chip 700 is illustrated as a discrete circuit, it is understood that any two or more of the components (e.g., 106 and 108) can be integrated as one circuit. In some embodiments, as the noise detector 108 is disposed on the same chip as the DUT 102, the noise detector 108 may be referred to as an "on-chip" circuit; and as the storage device 110 is disposed on a different chip from the DUT 102, the storage device 110 may be referred to as an "off-chip" circuit. Such an off-chip storage device may include a DRAM memory, a NAND flash memory, and a NOR flash array.

FIG. 8 shows an example where the DUT 102, the readout circuit 104, and the digital controller 106 are integrated into (or disposed on) a first integrated circuit (e.g., silicon) chip 800, while the noise detector 108 and the storage device 110 are disposed on a second integrated circuit (e.g., silicon) chip 802. Although each of the components on the chips 800 and 802 is illustrated as a discrete circuit, it is understood that any two or more of the components can be integrated as one circuit. In some embodiments, as the noise detector 108 and the storage device 110 are disposed on a different chip from the DUT 102, the noise detector 108 and the storage device 110 may be each referred to as an "off-chip" circuit. Such an off-chip noise detector may include a field-programmable gate array (FPGA), a data processing circuit, and a computer. Such an off-chip storage device may include a DRAM memory, a NAND flash memory, and a NOR flash array.

Figure 9:
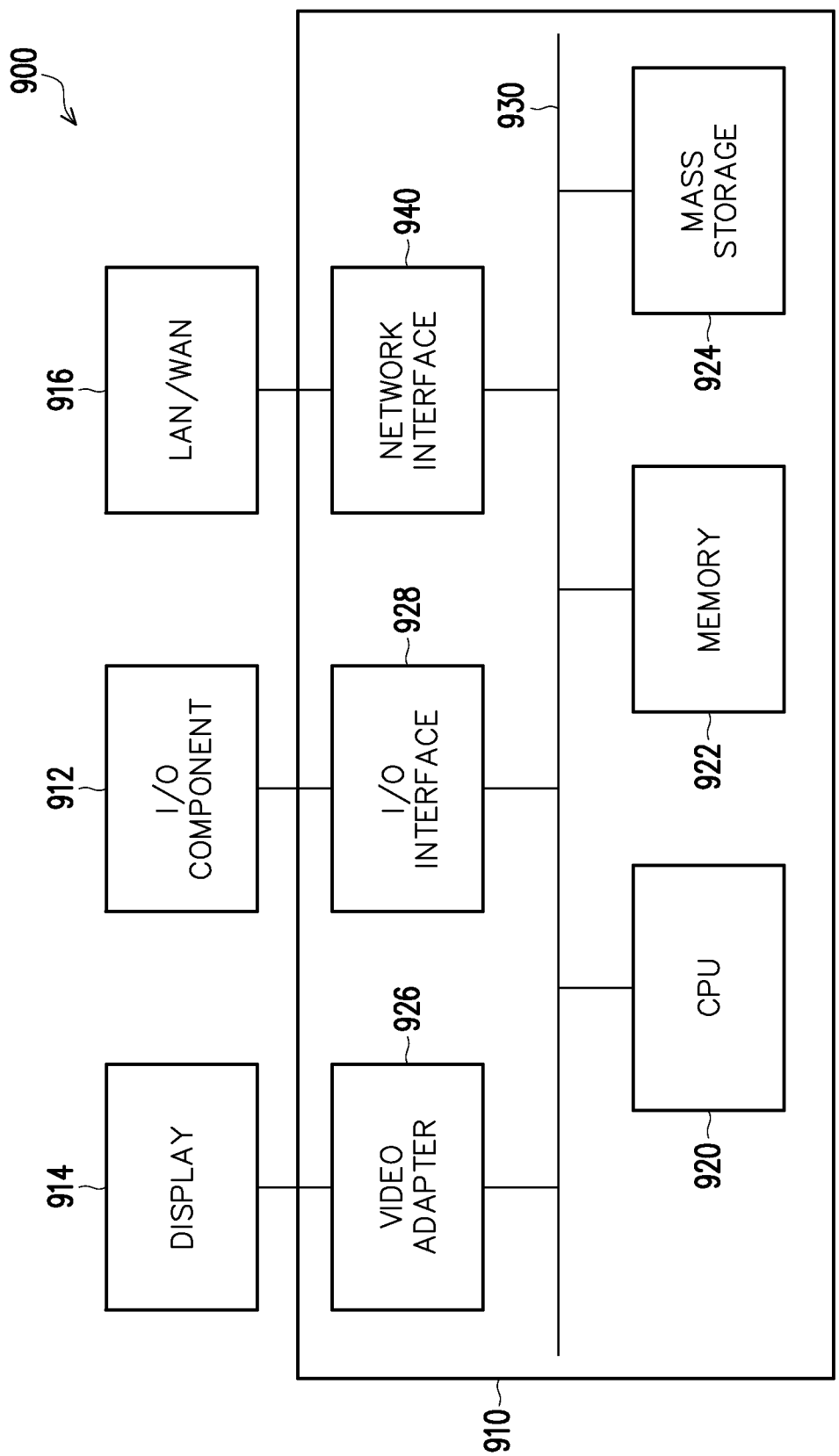
FIG. 9 illustrates a block diagram of an example information handling system (IHS), in accordance with some embodiments.

Referring now to FIG. 9, a block diagram of an information handling system (IHS) 900 is provided, in accordance with some embodiments of the present invention. The IHS 900 may be a computer platform used to implement any or all of the processes discussed herein to design an integrated circuit. The IHS 900 may comprise a processing unit 910, such as a desktop computer, a workstation, a laptop computer, or a dedicated unit customized for a particular application. The IHS 900 may be equipped with a display 914 and one or more input/output (I/O) components 912, such as a mouse, a keyboard, or printer. The processing unit 910 may include a central processing unit (CPU) 920, memory 922, a mass storage device 924, a video adapter 926, and an I/O interface 928 connected to a bus 930.

The bus 930 may be one or more of any type of several bus architectures including a memory bus or memory controller, a peripheral bus, or video bus. The CPU 920 may comprise any type of electronic data processor, and the memory 922 may comprise any type of system memory, such as static random access memory (SRAM), dynamic random access memory (DRAM), or read-only memory (ROM).

The mass storage device 924 may comprise any type of storage device configured to store data, programs, and other information and to make the data, programs, and other information accessible via the bus 930. The mass storage device 924 may comprise, for example, one or more of a hard disk drive, a magnetic disk drive, an optical disk drive, or the like.

The video adapter 926 and the I/O interface 928 provide interfaces to couple external input and output devices to the processing unit 910. As illustrated in FIG. 9, examples of input and output devices include the display 914 coupled to the video adapter 926 and the I/O components 912, such as a mouse, keyboard, printer, and the like, coupled to the I/O interface 928. Other devices may be coupled to the processing unit 910, and additional or fewer interface cards may be utilized. For example, a serial interface card (not shown) may be used to provide a serial interface for a printer. The processing unit 910 also may include a network interface 940 that may be a wired link to a local area network (LAN) or a wide area network (WAN) 916 and/or a wireless link.

It should be noted that the IHS 900 may include other components/devices. For example, the IHS 900 may include power supplies, cables, a motherboard, removable storage media, cases, and the like. These other components/devices, although not shown, are considered part of the IHS 900.

In one aspect of the present disclosure, a method for testing semiconductor devices is disclosed. The method includes: obtaining, by a noise detector, a first result measured on a semiconductor device in one of a first set of tests; comparing, by the noise detector, the first result with a first boundary value and a second boundary value, the first boundary value corresponding to a maximum value determined among respective results that were previously measured on the semiconductor device in one or more of the first set of tests, the second boundary value corresponding to a minimum value determined among respective results that were previously measured on the semiconductor device in one or more of the first set of tests; determining, by the noise detector based on the comparison between the first result and the first and second boundary values, whether to update the first boundary value and the second boundary value to calculate a first delta value; comparing, by the noise detector, the first delta value with a noise threshold value; determining, by the noise detector based on the comparison between the first delta value and the noise threshold value, whether to update a value of a timer; determining, by the noise detector, that the value of the timer satisfies a timer threshold; and tentatively determining, by the noise detector according to the determination, that the semiconductor device incurs noise.

In another aspect of the present disclosure, a system to test semiconductor devices is disclosed. The system includes a storage device and a noise detector. The noise detector can obtain, in one of a first set of tests, a first result measured on a semiconductor device; retrieve, from the storage device, a first boundary value and a second boundary value, the first boundary value corresponding to a maximum value determined among respective results that were previously measured on the semiconductor device in one or more of the first set of tests, the second boundary value corresponding to a minimum value determined among respective results that were previously measured on the semiconductor device in one or more of the first set of tests; compare the first result with the first boundary value and the second boundary value; either update, responsive to determining that the first result is greater than the first boundary value, the first boundary value in the storage device with the first result, or update, responsive to determining that the first result is less than the second boundary value, the second boundary value in the storage device with the first result, or maintain, responsive to determining that the first result is neither greater than the first boundary value nor less than the second boundary value, the first boundary value and the second boundary value in the storage device; calculate a first delta value based on a difference between the first boundary value and the second boundary value; compare the first delta value with a noise threshold value; either update, responsive to determining that the first delta value is greater than or equal to the noise threshold value, a value of a timer in the storage device, or maintain, responsive to determining that the first delta value is less than the noise threshold value, the value of the timer in the storage device; determine that the value of the timer satisfies a timer threshold; and tentatively determine, according to the determination, that the semiconductor device incurs noise.

In yet another aspect of the present disclosure, a non-transient computer-readable storage medium having instructions embodied thereon is disclosed. The instructions are executable by one or more processors to perform a method. The method includes: (a) obtaining a first result measured on a semiconductor device in one of a first set of tests; (b) comparing the first result with a first boundary value and a second boundary value, the first boundary value corresponding to a maximum value determined among respective results that were previously measured on the semiconductor device in one or more of the first set of tests, the second boundary value corresponding to a minimum value determined among respective results that were previously measured on the semiconductor device in one or more of the first set of tests; (c) determining, based on the comparison between the first result and the first and second boundary values, whether to update the first boundary value and the second boundary value to calculate a first delta value; (d) comparing the first delta value with a noise threshold value; (e) iteratively performing steps (a) to (d) until a number of the first set of tests satisfies a predefined test condition; (f) determining, based on the comparison between the first delta value and the noise threshold value, whether to update a value of a timer; (g) determining that the value of the timer satisfies a timer threshold; and (h) determining, responsive to the determination, that the semiconductor device incurs noise.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for testing semiconductor devices, comprising:
    obtaining, by a noise detector, a plurality of first results measured on a semiconductor device;
    comparing, by the noise detector, each of the plurality of first results with a stored first boundary value and a stored second boundary value, wherein the stored first boundary value corresponds to a maximum value determined from a plurality of second results measured on the semiconductor device, and the stored second boundary value corresponds to a minimum value determined from a plurality of third results measured on the semiconductor device;
    determining, by the noise detector based on the comparison between each of the plurality of first results and each of the stored first boundary value and the stored second boundary value, whether to update the stored first boundary value and the stored second boundary value;
    in response to the comparison, updating, by the noise detector, the stored first boundary value to a maximum value of the plurality of first results, and the stored second boundary value to a minimum value of the plurality of first results;
    calculating, by the noise detector, a first delta value that is a difference between the updated first boundary value and the updated second boundary value; and
    updating, by the noise detector, a timer corresponding to random telegraph noise (RTN) of the semiconductor device responsive to the first delta value exceeding a first noise threshold.

2. The method of claim 1, further comprising retrieving, by the noise detector, the stored first boundary value and the stored second boundary value from a storage device.

3. The method of claim 2, wherein each of the semiconductor device, the noise detector, and the storage device are defined in the same chip.

4. The method of claim 2, wherein each of the semiconductor device and the noise detector are defined in a first chip, and the storage device is defined in a second chip different from the first chip.

5. The method of claim 2, wherein the semiconductor device is defined in a first chip, and the noise detector and the storage device are included in a second chip different from the first chip.

6. The method of claim 1, further comprising:
    obtaining, by the noise detector, a second result measured on the semiconductor device in one of a second set of tests;
    comparing, by the noise detector, the second result with a third boundary value and a fourth boundary value, the third boundary value corresponding to a maximum value determined among respective results that were previously measured on the semiconductor device in one or more of the second set of tests, the fourth boundary value corresponding to a minimum value determined among respective results that were previously measured on the semiconductor device in one or more of the second set of tests;
    determining, by the noise detector based on the comparison between the second result and the third and fourth boundary values, that the third boundary value and the fourth boundary value are to be updated to calculate a second delta value; and responsive to determining to update the third boundary value and the fourth boundary value, calculating, by the noise detector, the second delta value.

7. The method of claim 6, further comprising:
comparing, by the noise detector, the second delta value with a noise threshold value;
increasing, by the noise detector, a value of the timer determined from the second set of tests based on the comparison between the second delta value and the noise threshold value; and
determining, by the noise detector, that the semiconductor device incurs noise based on the value of the timer and a timer threshold.

8. The method of claim 7, further comprising screening, by the noise detector, the semiconductor device from being accessed responsive to determining that the semiconductor device incurs noise.

9. The method of claim 1, wherein obtaining the plurality of first results measured on the semiconductor device comprises communicating, by the noise detector, with an analog-to-digital converter to obtain the plurality of first results.

10. The method of claim 1, further comprising determining, by the noise detector, a relative position of the semiconductor device in an array of a plurality of semiconductor devices.

11. A system to test semiconductor devices, comprising:
a storage device; and
a noise detector, the noise detector to:
obtain a plurality of first results measured on a semiconductor device;
compare each of the plurality of first results with a stored first boundary value and a stored second boundary value, wherein the stored first boundary value corresponds to a maximum value determined from a plurality of second results measured on the semiconductor device, and the stored second boundary value corresponds to a minimum value determined from a plurality of third results measured on the semiconductor device;
determine, based on the comparison between each of the plurality of first results and each of the stored first boundary value and the stored second boundary value, whether to update the stored first boundary value and the stored second boundary value;
in response to the comparison, update the stored first boundary value by to a maximum value of the plurality of first results, and the stored second boundary value to a minimum value of the plurality of first results;
calculate a first delta value that is a difference between the updated first boundary value and the updated second boundary value; and
update a timer corresponding to random telegraph noise (RTN) of the semiconductor device responsive to the first delta value exceeding a first noise threshold.

12. The system of claim 11, wherein the storage device includes a device selected from the group consisting of: an embedded flash memory, a static random access memory (SRAM), a magnetoresistive random access memory (MRAM), and a register array.

13. The system of claim 11, further comprising an integrated chip upon which the semiconductor device, the noise detector, and the storage device are defined.

14. The system of claim 11, further comprising:
a first chip upon which the semiconductor device and the noise detector are defined; and
a second chip upon which the storage device is defined, the second chip different from the first chip.

15. The system of claim 11, further comprising:
a first chip upon which the semiconductor device is defined; and
a second chip upon which the noise detector and the storage device are defined, the second chip different from the first chip.

16. The system of claim 11, further comprising:
an analog-to-digital converter to provide the plurality of first results measured on the semiconductor device in a digital form, wherein the noise detector is to communicate with the analog-to-digital converter to obtain the plurality of first results.

17. The system of claim 11, wherein the noise detector is to update a value of the timer by consecutively increasing or decreasing the value of the timer by one.

18. The system of claim 11, wherein the noise detector is to:
obtain a second result measured on the semiconductor device in one of a second set of tests;
compare the second result with a third boundary value and a fourth boundary value, the third boundary value corresponding to a maximum value determined among respective results that were previously measured on the semiconductor device in one or more of the second set of tests, the fourth boundary value corresponding to a minimum value determined among respective results that were previously measured on the semiconductor device in one or more of the second set of tests;
determine, based on the comparison between the second result and the third and fourth boundary values, that the third boundary value and the fourth boundary value are to be updated to calculate a second delta value; and
responsive to determining to update the third boundary value and the fourth boundary value, calculate the second delta value.

19. The system of claim 18, wherein the noise detector is to:
compare the second delta value with a noise threshold value;
increase a value of the timer determined from the second set of tests based on the comparison between the second delta value and the noise threshold value; and
determine that the semiconductor device incurs noise based on the value of the timer and a timer threshold.

20. A non-transitory computer-readable storage medium having instructions embodied thereon that, when executed by one or more processors, cause the one or more processors to perform a method comprising:
obtaining a plurality of first results measured on a semiconductor device;
comparing each of the plurality of first results with a stored first boundary value and a stored second boundary value, wherein the stored first boundary value corresponds to a maximum value determined from a plurality of second results measured on the semiconductor device, and the stored second boundary value corresponds to a minimum value determined from a plurality of third results measured on the semiconductor device;
determining, based on the comparison between each of the plurality of first results and each of the stored first boundary value and the stored second boundary value, whether to update the stored first boundary value and the stored second boundary value;

in response to the comparison, updating the stored first boundary value to a maximum value of the plurality of first results, and the stored second boundary value to a minimum value of the plurality of first results;

calculating a first delta value that is a difference between the updated first boundary value and the updated second boundary value; and updating a timer corresponding to random telegraph noise (RTN) of the semiconductor device responsive to the first delta value exceeding a first noise threshold.

* * * * *